(12) United States Patent
Kamide

(10) Patent No.: US 6,350,698 B1
(45) Date of Patent: Feb. 26, 2002

(54) DRY ETCHING APPARATUS AND ITS MANUFACTURING METHOD

(75) Inventor: Yukihiro Kamide, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/343,176

(22) Filed: Jun. 30, 1999

(30) Foreign Application Priority Data

Jul. 3, 1998 (JP) ............................................ 10-188672

(51) Int. Cl.⁷ ................................................ H01L 21/00
(52) U.S. Cl. ....................... 438/715; 156/345; 438/716; 438/729
(58) Field of Search ........................... 156/345; 118/715, 118/723, 500; 204/298.15; 414/935, 754; 216/58, 67; 438/706, 716, 710, 715, 729

(56) References Cited

U.S. PATENT DOCUMENTS

| 4,632,719 A | * 12/1986 | Chow et al. ................. 156/345 |
| 5,698,036 A | * 12/1997 | Ishii et al. .......... 118/723 MW |
| 5,863,843 A | * 1/1999 | Green et al. ................. 438/771 |
| 5,879,128 A | * 3/1999 | Tietz et al. .................. 414/757 |

* cited by examiner

*Primary Examiner*—William A. Powell
(74) *Attorney, Agent, or Firm*—Sonnenschein, Nath & Rosenthal

(57) ABSTRACT

In a dry etching apparatus, a susceptor cover is attached to a substrate susceptor to shape it into a tapered contour, and no other element is positioned around a wafer support plane to ensure a flatness. A wafer positioning mechanism is provided near the perimeter of the wafer support plane, and it is raised to extend to a level higher than the wafer support plane and used in this status only upon setting or removing the wafer.

8 Claims, 11 Drawing Sheets

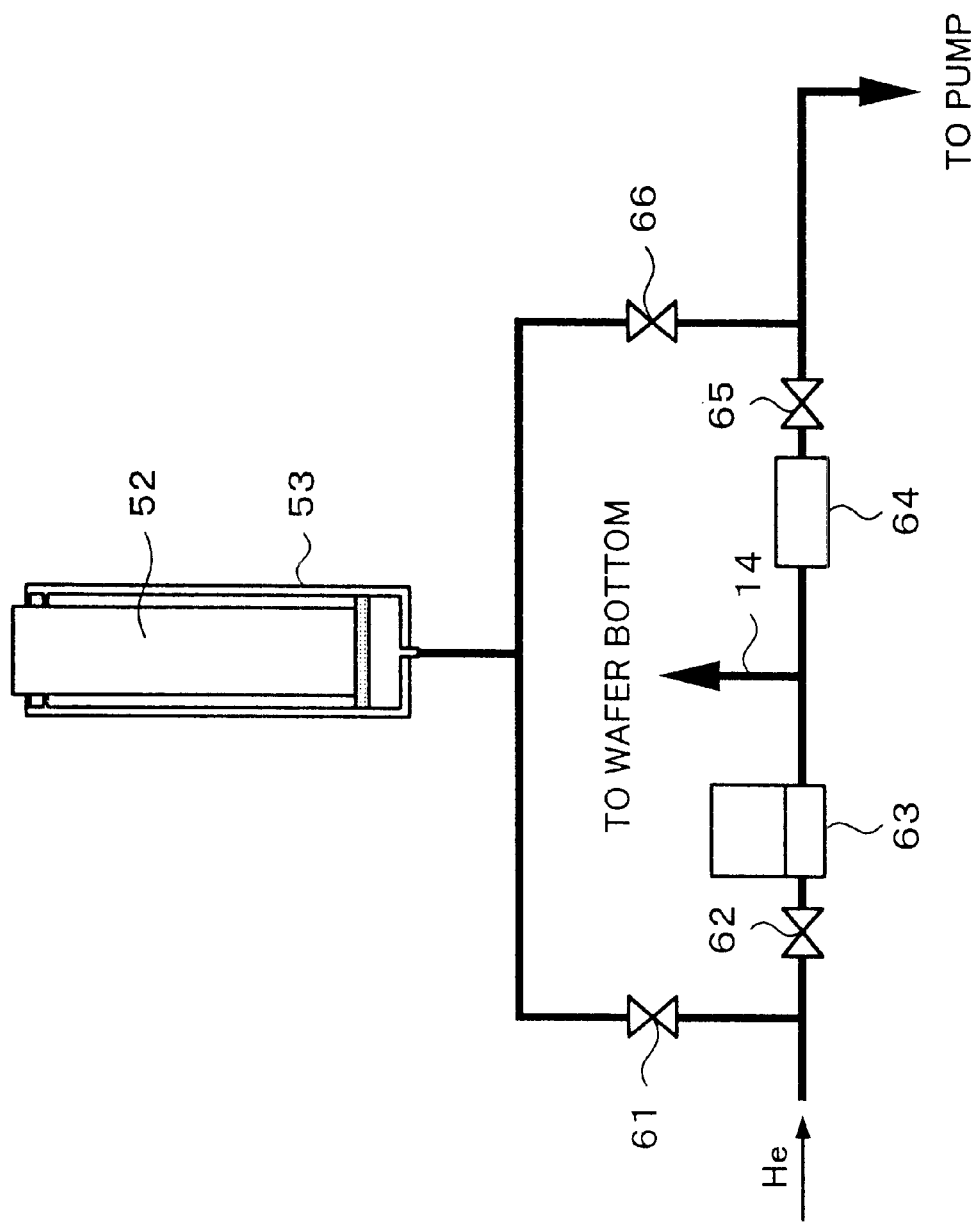

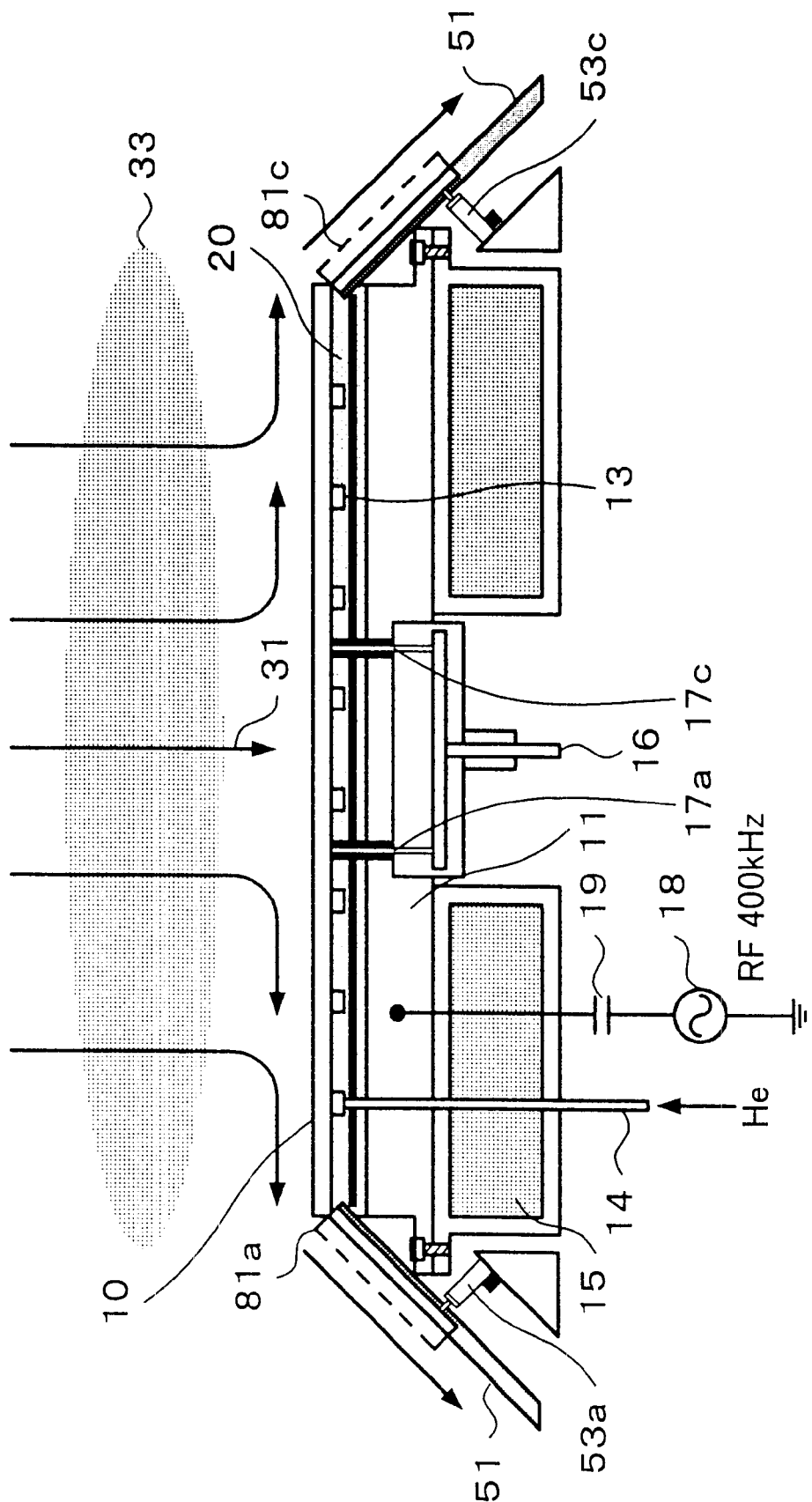

DRY ETCHING APPARATUS AND ITS MANUFACTURING METHOD

RELATED APPLICATION DATA

The present application claims priority to Japanese Application No. P10 188672 filed Jul. 03, 1998, which application is incorporated herein by reference to the extent permitted by law.

BACKGROUND OF THE INVENTION

1. Field of the Invention

This invention relates to a dry etching apparatus used in fabrication of super LSIs, and so forth, for micro processing of a pattern by exciting and activating a gas with electric-discharge plasma to make it interact with a substance on a wafer and then evacuating it, and also relates to a method for dry-etching a substrate.

2. Description of the Related Art

Along with progressive miniaturization of semiconductor devices, for the purpose of enabling processing of finer patterns than those heretofore realized dy dry etching apparatuses as their manufacturing apparatuses, further improvements are under progress with employment of a method ensuring highly even electric discharge of a plasma and realization of high-speed evacuation. Together with improvements of such etching techniques, reduction of particles for preventing defects in micro-sized patterns during processing is an important factor required in manufacturing apparatuses. In order to prevent products of reaction as a major source of particles from accumulating in a reaction chamber during processing, there is a movement toward reducing parts in the reaction chamber and simplifying the flow of reaction products.

An example of conventional dry etching apparatuses is shown in FIG. 1. Shown here is a substrate susceptor by reference numeral 101. The substrate susceptor 101 mainly comprises a lower electrode 111, an annular focus ring 112, and so on. The lower electrode 111 has formed on its top surface a groove 113 for a cool gas, and the groove 113 is connected to a cool gas supply/exhaust line 114. Helium gas, for example, is used as the cool gas. Provided inside the lower electrode 111 are a cooling tank 115 containing a refrigerant and a wafer push-up mechanism 116 located in a central position. The lower electrode 111 is connected to a high-frequency power source 118 via a capacitor 119.

Further referring to FIG. 1, reference numeral 102 denotes an upper end portion of the reaction chamber. The upper end portion 102 of the reaction chamber is dome-shaped, and a coil 123 fitting on the outer circumferential surface of the dome-shaped upper end portion 102 is connected with its one end to a high-frequency power source 121 via a capacitor 122 and with the other end to the ground.

Still referring to FIG. 1, reference numeral 110 denotes a wafer to be processed by etching. The wafer 110 is transported by a carrier arm, not shown, and put on the substrate susceptor 101 at a position where the inner circumferential surface of the focus ring 112 functions as positional definition thereof. Additionally, etching gas inlets and exhaust gas outlets, not shown, are provided at lateral locations relative to the position where the wafer 110 lie. A predetermined etching gas is supplied through the inlets into the reaction chamber, and electric-discharge plasma is generated in the reaction chamber held under a predetermined low pressure and a predetermined temperature held in the reaction chamber by applying high-frequency voltages to the lower electrode 111 and the high-frequency coil 123 from high-frequency power sources 118, 121. The electric-discharge plasma excites and activates the etching gas to have it interact with a substance on the wafer and thereby invite etching. In this process, flows of the etching gas from the inlets move along the contour of the dome-shaped upper end portion 102 as shown by arrows in FIG. 1 first to the central portion, there turn their directions to move downward through the plasma region 133, then turn their directions near the surface of the wafer 110 to move laterally while licking the surface of the wafer 110, and finally move to the exhaust gas outlets.

In the above-introduced dry etching apparatus using electric-discharge plasma, a complex electric-discharge mechanism occupies the space just above the wafer, and the etching gas inlets are located at lateral positions relative to the wafer. Therefore, the etching gas circulates through the plasma region 133. As a result, reaction products which should be discharged by flows of the gas are re-dissociated by the plasma and adhere to any in the reaction chamber. More specifically, stagnation occurs in the gas flows at the stepped portion of the focus ring 112 surrounding the wafer 110, and reaction products accumulate there as shown at 132 in FIG. 1 and may cause generation of dust due to re-dissociation of the reaction products 132.

For the purpose of overcoming the problem, namely, preventing re-adhesion of reaction products, there is proposed a dry etching apparatus smoothing gas flows by removing any step disturbing evacuation of the gas, like that on the focus ring, from the portion around the wafer. FIG. 2 shows such a dry etching apparatus removing the focus ring to make a flat plane. In FIG. 2, elements and parts common to those of the apparatus shown in FIG. 1 are labeled with common reference numerals.

In case of the dry etching apparatus shown in FIG. 2, the upper end portion 102 of the reaction chamber is configured as a flat plate, and the coil 123 fitting on the outer circumferential surface of the flat upper end portion 102 is connected with its one end to the high-frequency power source 121 via the capacitor 122 and with the other end to the ground. Additionally, an upper electrode 124 is attached onto the flat upper end portion 102. The upper electrode 124 has formed diffusion holes 125 distributed all over its area to introduce an etching gas, and these diffusion holes 125 are connected to an etching gas inlet tube 126.

In the dry etching apparatus having the above-explained structure, the etching gas supplied through the diffusion holes 125 falls down from the respective diffusion holes 125 through the plasma region 133 to the proximity of the wafer, there changes its direction to move transversely while licking the surface of the wafer 110, and finally moves to the exhaust gas outlets.

However, the dry etching apparatus shown in FIG. 2 also fails to remove the possibility that not a small amount of reaction products accumulate along the perimeter of the substrate susceptor 101 around the wafer 110 as shown at 132 in FIG. 2, and dust is generated due to re-dissociation of the reaction products 132. On the other hand, since this apparatus removes any step like that made by the focus ring for the purpose of making smooth gas flows, it has no means to mechanically determine the setting position of the wafer 110 transported there, and therefore involves the possibility that the wafer is offset from the proper setting position as shown by the broken line and an arrow in FIG. 2, for example, and thereby disables its transport. As reviewed above, conventional dry etching apparatuses were compelled to determine the structure of the substrate susceptor so as to preferentially select one at the cost of the other of the requirements, namely, preventing generation of particles in the reaction chamber and ensuring reliable transport of wafers, and no dry etching apparatus satisfying both these requirements has been proposed heretofore.

OBJECTS AND SUMMARY OF THE INVENTION

It is therefore an object of the invention to provide a dry etching apparatus capable of minimizing adhesion of reaction products, or any other matters, which will become a source of particles, and simultaneously ensuring stable transport, and to provide a method for dry-etching substrates by using the dry etching apparatus.

According to the invention of the second claim, there is provided a dry etching apparatus characterized in that a substrate susceptor has a portion for contact with a wafer, having a diameter not larger than the diameter of the wafer, and no element is provided in any level higher than the top surface of the wafer and in the same level as the bottom surface of the wafer around the wafer.

According to the invention, there is further provided a method for dry-etching a substrate by using the dry etching apparatus.

In the present invention, a susceptor cover is attached to a substrate susceptor to shape it into a tapered contour, and no other element is positioned around a wafer support plane to ensure a flatness. Additionally, a predetermined distance is provided between the side wall of the reaction chamber and the substrate susceptor, and exhaust gas outlets of the etching gas are located in a lower level in the reaction chamber, to reliably prevent opposite flows of the gas toward the electric discharge plasma. Therefore, the etching gas smoothly moves toward the exhaust gas outlets at a lower level in the reaction chamber, and products generated by interaction with the wafer and products of sputtering of members of the apparatus do not accumulate near the wafer although it may accumulate near the exhaust gas outlets located in a lower level in the reaction chamber. Therefore, adhesion of such products of interaction or sputtering onto the wafer is minimized.

Additionally, in the present invention, four columnar pins made of an insulating material and four cylinders for extending and contracting the pins are provided near the perimeter of the wafer support plane in intervals of 90 to form a wafer positioning mechanism, and these four columnar pins are moved to extend to a level higher than the wafer support plane and thereby engage with the side edge of the wafer only upon setting and removing the wafer, and are withdrawn into the substrate susceptor during etching. Therefore, the positioning mechanism prevents a positional offset of the wafer upon setting and removing same without adversely affect the etching quality of the wafer.

The above, and other, objects, features and advantage of the present invention will become readily apparent from the following detailed description thereof which is to be read in connection with the accompanying drawings.

BRIEF DESCRIPTION OF THE DRAWINGS

FIG. 5 is a schematic diagram for explaining a positioning mechanism used in the embodiment of the invention;

FIG. 9 is a schematic diagram showing construction of a substrate susceptor used in the further embodiment of the invention;

DETAILED DESCRIPTION OF THE PREFERRED EMBODIMENTS

Figure 1:
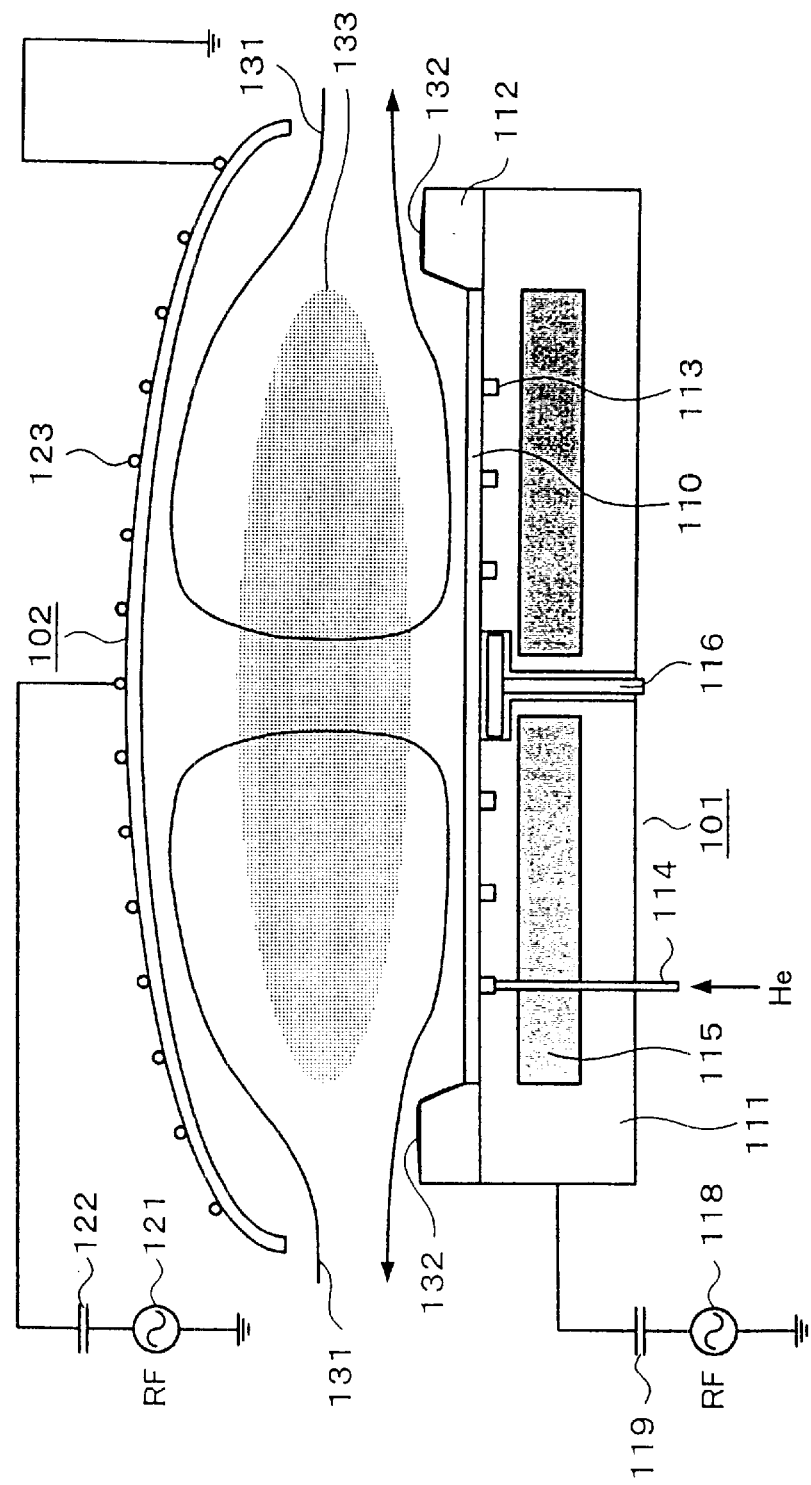
FIG. 1 is a schematic diagram for explaining a conventional dry etching apparatus.
Figure 2:
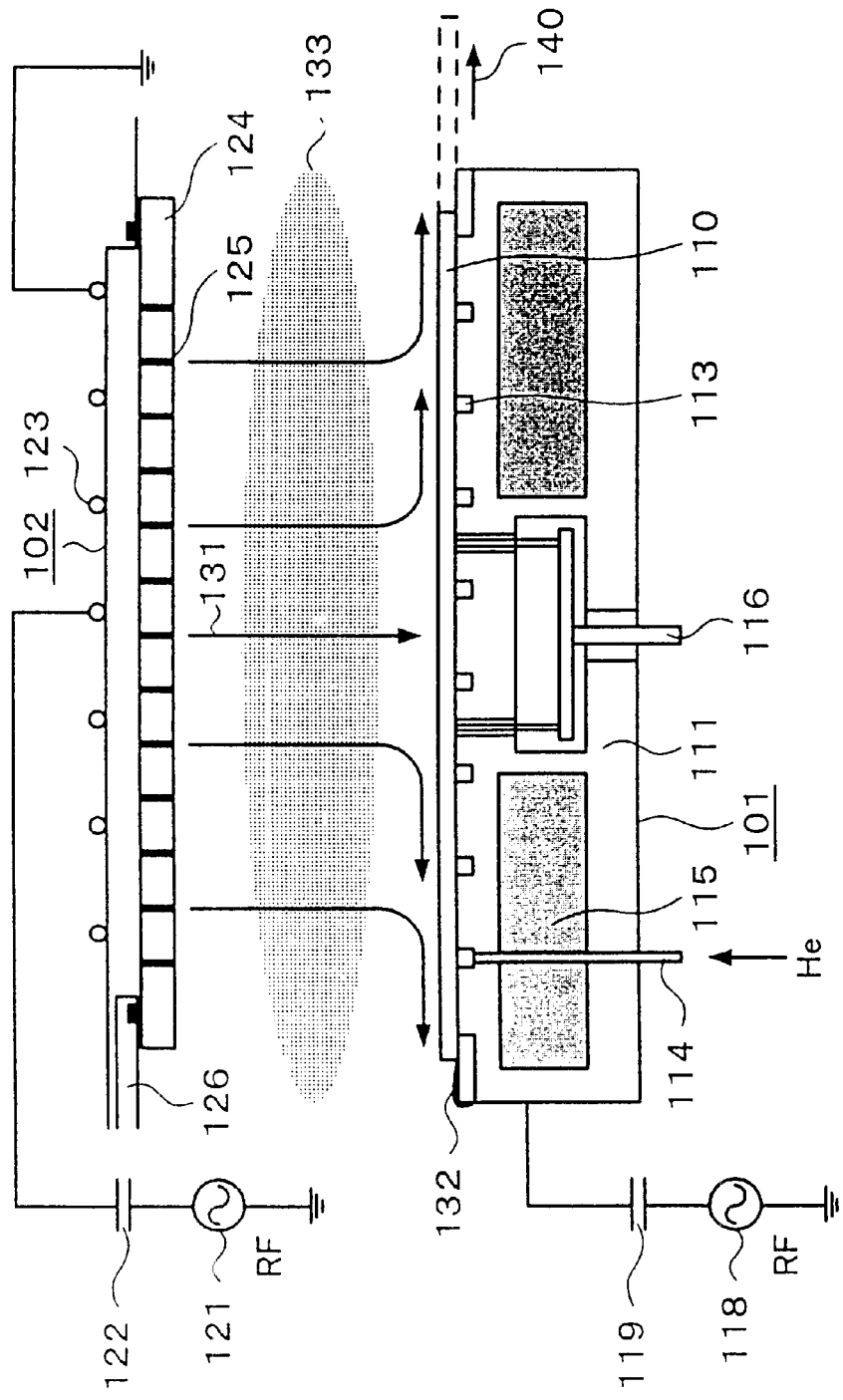
FIG. 2 is a schematic diagram for explaining another conventional dry etching apparatus.
Figure 3:
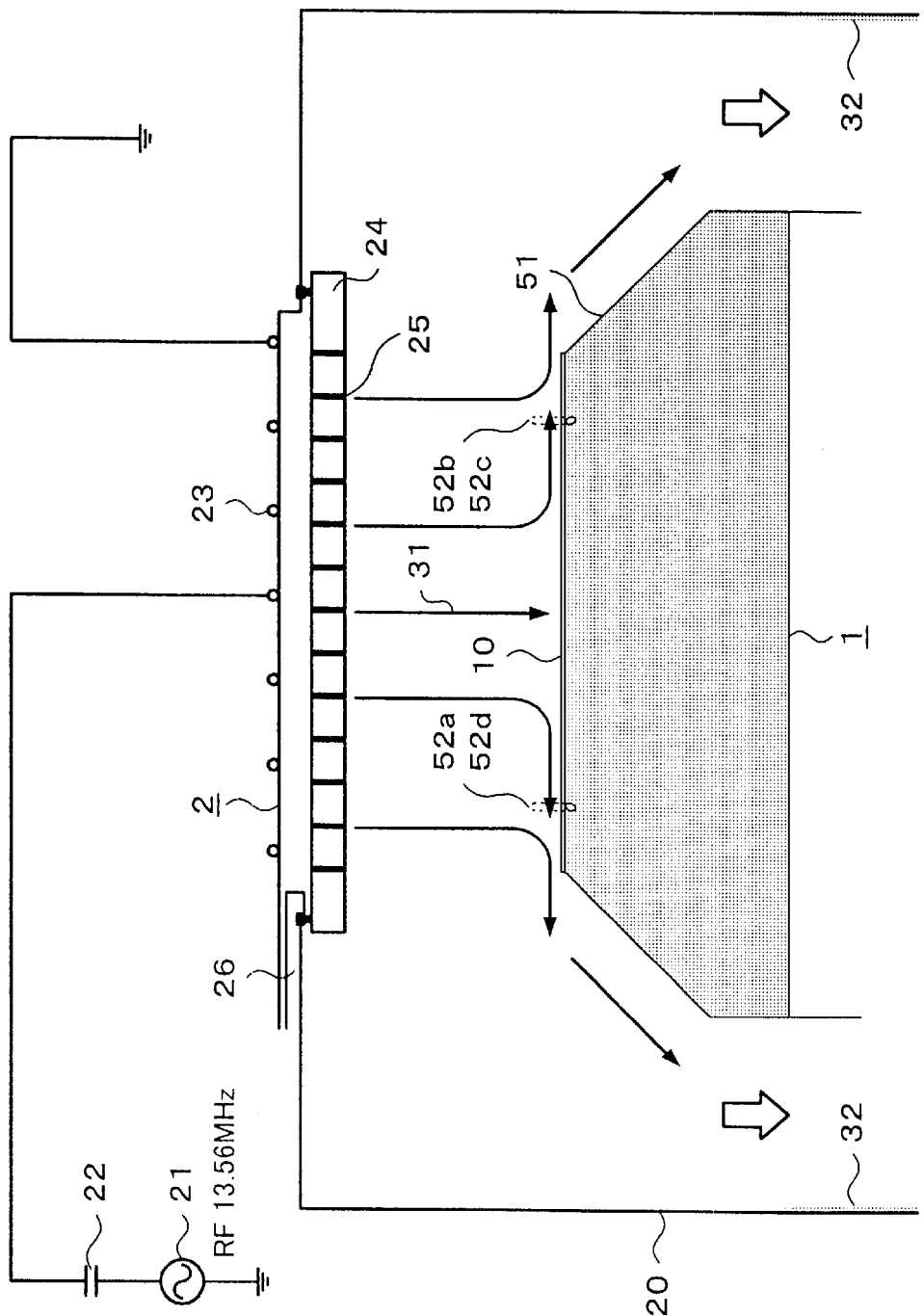
FIG. 3 is a schematic diagram showing a central part of an embodiment of the invention.

An embodiment of the invention is explained below with reference to FIGS. 3, 4, 5, 6A through 6D and 7A through 7D. FIG. 3 shows a central part of the embodiment as an application of the invention in form of a dry etching apparatus using an inductively coupled plasma source. The dry etching apparatus shown here is used for etching polycrystalline silicon of 200 mm wafers, for example.

Numeral 2 in FIG. 3 denotes an upper end portion of a reaction chamber. The reaction chamber has a cylindrical shape with the diameter of 500 mm or more, for example, the its upper end portion 2 is flat-shaped. On the outer surface of the flat upper end portion 2, a high-frequency coil 23 is provided. One end of the high-frequency coil 23 is connected to a high-frequency power source 21 oscillating at 13.56 MHz, for example, via a capacitor 22, and the other end of the high-frequency coil 23 is connected to the ground.

Affixed to the flat upper end portion 2 is an upper electrode 24 made of a ceramic such as alumina ($Al_2O_3$) ceramics. The upper electrode 24 has formed diffusion holes 25 spread over its entire area to introduce an etching gas, the diffusion holes 25 communicate with the etching gas inlet pipe 26. Therefore, the upper electrode 24 is configured as an inductively coupled plasma source having a coil-shaped antenna, and an etching gas is supplied into the reaction chamber through the diffusion holes 25 formed in the upper electrode 24.

Reference numeral 1 in FIG. 3 denotes a substrate susceptor. The substrate susceptor 1 has formed on its upper end portion a circular support surface with the diameter of 200 mm or less, for example, to support a wafer thereon. No other member is located around the support surface to ensure a flat plane be made there. Numeral 10 in FIG. 3 denotes a polycrystalline silicon wafer with the diameter of 200 mm, for example, which is to be processed by etching. The wafer 10 is transported by a carrier arm, not shown, and put on the support surface of the substrate susceptor 1 as shown in FIG. 3.

In FIG. 3, numerals 52a, 52d, 52b and 52c are four columnar pins provided as a wafer positioning mechanism.

These four pins 52a, 52d, 52b and 52c are located at intervals of 90 near the perimeter of the wafer support surface, and are used upon setting of removing the wafer 10. during etching, these pins retract inside the substrate susceptor 1. This positioning mechanism and its operation will be explained later in greater detail.

A susceptor cover 51 made of a ceramic is attached to the susceptor 1 as shown in FIG. 3. The entire outer shape of the substrate susceptor 1 is made up of a base portion with a predetermined diameter and a tapered portion made by connecting the base portion to the wafer support surface smaller in diameter than the base portion with the susceptor cover 51. The substrate susceptor 1 is located in a central portion in the reaction chamber to maintain a distance of 100 mm or more from the side wall 20 of the reaction chamber, and etching gas exhaust outlets are formed in a lower portion, not shown, of the reaction chamber.

More specifically, the tapered shape is made by attaching the susceptor cover 5 to the substrate susceptor 1; no other member is mounted or attached around the wafer support surface to ensure a flatness; a space of a predetermined distance is made between the side wall 20 of the reaction chamber and the substrate susceptor 1; and the etching gas exhaust outlets are located at a lower level in the reaction chamber. Thereby, smooth gas flows are ensured, and the gas after etching reaction is prevented from oppositely flowing toward the electric discharge plasma. Therefore, the etching gas supplied through the diffusion holes 25 falls down from the respective diffusion holes 25 as shown by arrows 31 in FIG. 3, then changes its direction transversely while licking the surface of the wafer 110, then moves along the susceptor cover 5, and finally moves to the exhaust gas outlets at a lower level in the reactive chamber.

As a result, reaction products 32 resulting from reaction with the wafer 10 during etching never accumulate near the wafer 10, although it may accumulate near the exhaust gas outlets located in a lower level in the reaction chamber as shown in FIG. 3. Even if the accumulated reaction products 32 peel off near the exhaust gas outlets, adhesion of these reaction products 32 onto the wafer 10 can be prevented by continuously flowing the etching gas both during etching and in its intervals.

Figure 4:
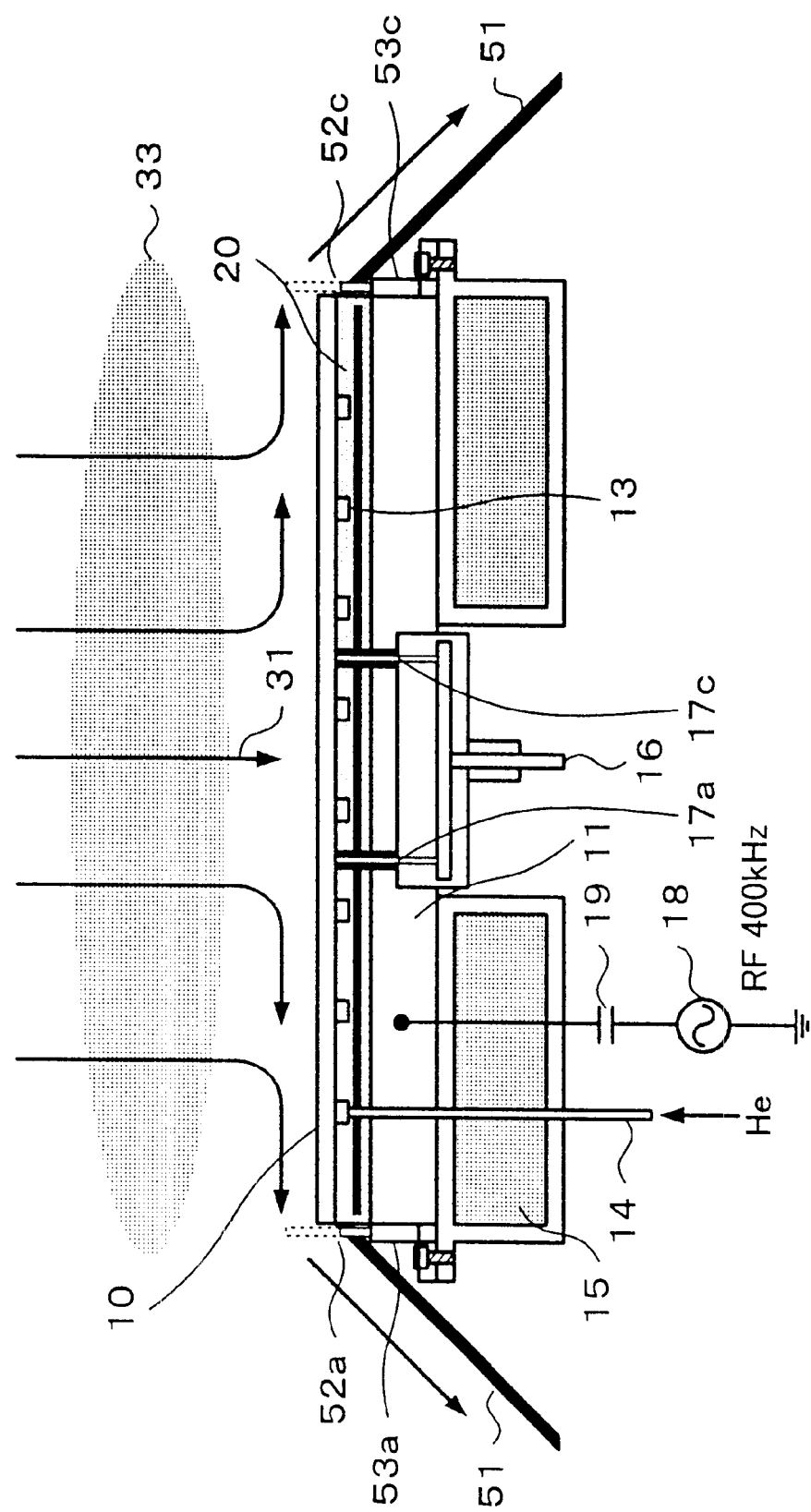
FIG. 4 is a schematic diagram showing construction of a substrate susceptor used in the embodiment of the invention.

Detailed construction of the above-explained substrate susceptor 1 is shown in FIG. 4. Here are used common reference numerals for elements corresponding to those of FIG. 3. The substrate susceptor 1 is made up of a lower electrode 11, electrostatic chuck 20, and susceptor cover 51, among others, as shown in FIG. 4.

At the portion of the substrate susceptor 1 for contact with the wafer, as referred to above, the electrostatic chuck 20 is provided, which is made of a ceramic like alumina ($Al_2O_3$) as a dielectric material of the same size as the wafer 10, namely, with the diameter of 200 mm, for example. The electrostatic chuck 20 has formed on its upper surface, i.e., the surface for contact with the wafer, triple grooves for a cooling gas. These grooves 13 communicate with a cooling gas supply/exhaust pipe tube 14. The cooling gas may be, for example, helium gas. By supplying helium gas into the grooves 13 upon sucking and stably positioning the wafer with the electrostatic chuck 20, the cooling effect os the wafer 10 is increased.

On the bottom surface of the electrostatic chuck 20, the lower electrode 11 made of aluminum is provided in contact therewith. A wafer push-up mechanism 16 including four standing pins 17a, 17b, 17c and 17d is located in a central position inside the lower electrode 11. Further provided in contact with the lower electrode 11 is a cooling tank 15 containing a refrigerant therein. The cooling tank 15 is as large as the wafer 10, namely, as large as 200 mm in diameter, to uniformly cool the entire surface of the wafer in position. The junction between the electrostatic chuck 20 and the cooling tank 15, which are joined together with bolts, extends beyond the perimeter of the wafer. However, since the outer contour of the substrate susceptor 1 is amply tapered to allow this difference in diameter, the substrate susceptor 1 can be mounted with no obstacle.

The lower electrode 11 sandwiched between the electrostatic chuck 20 and the cooling tank 15 is connected to an ion-introducing high-frequency power source 18 oscillating at 400 kHz, for example, via a capacitor 19.

Therefore, by supplying a predetermined etching gas into the reaction chamber through the diffusion holes 25 of the upper electrode, thus maintaining a predetermined low pressure and a predetermined temperature, and applying high-frequency voltages to the upper electrode 11 and the high-frequency coil 23 from their high-frequency power sources 18, 21, electric discharge plasma can be generated in a predetermined region. The electric discharge plasma excites and activates the etching gas and makes it interact with a substance on the wafer. Thus, an etching process takes place. At that time, the reaction products 32 generated by interaction with the wafer 10 do not accumulate near the wafer 10 as explained above although it may accumulate near the exhaust gas outlets located in a lower level in the reaction chamber. Additionally, it is possible that ions enter into the space around the susceptor cover 51 as well due to a high-frequency voltage applied to the lower electrode 11 and cause sputtering of the ceramic. However, since the outer contour of the substrate susceptor is tapered as a whole, possible products of sputtering are also guided toward the exhaust gas outlets, and their adhesion onto the wafer 10 can be prevented.

The elements labeled with 52a and 52c in FIG. 4 are two of the four columnar pins 52a, 52b, 52c and 52d used to form the wafer positioning mechanism. These four ping 52a, 52b, 52c and 52d prevent positional offset of the wafer when it is set in and removed from the position. In FIG. 4, pins 52b and 52d are omitted from illustration. The wafer positioning mechanism is made up of the columnar pins 52a, 52b, 52c, 52d and four extend/contracting cylinders 53a, 53b, 53c, 53d, among others. These four columnar pins 52a, 52b, 52c, 52d and four extend/contracting cylinders 53a, 53b, 53c, 53d are located in intervals of 90 near the perimeter of the wafer support plane. Since the positioning mechanism is mounted inside the substrate susceptor 1 supplied with a high-frequency voltage, it is made of an insulating material such as quartz, alumina or resin to prevent abnormal electric discharge. Concretely, the pins 52a, 52b, 52c, 52d are made of quartz.

These four columnar pins 52a, 52b, 52c, 52d are extended to a level higher than the wafer support surface to contact the edge of the wafer only during setting or removing the wafer 10. during etching, they are contracted to sit inside the substrate susceptor 1. That is, the extend/contracting cylinders 53a, 53b, 53c, 53d are driven with a gas pressure as their power to extend and contract the pins 52a, 52b, 52c, 52d upward and downward perpendicularly of the wafer support surface.

FIG. 5 shows a gas pressure circuit for driving the cylinders 53a, 53b, 53c, 53d. Here is used, for example, the above-explained cooling gas supply/exhaust system to and from the bottom surface of the wafer as shown in FIG. 5. A main line is made up of a valve 62, MFC 63 as a flowmeter having a flow rate control function, conductance C for controlling the exhaust flow rate, and valve 65 between a cooling gas source and an exhaust pump. From the junction between MFC 63 and conductance C, the cooling gas supply/exhaust tube 14 extends to the bottom surface of the wafer. The cylinder 53 having the columnar pins 52a through 52d is connected to the cooling gas source in parallel with the main line via a valve 61, and connected to an exhaust pump via a valve 66.

When a wafer is put in position, the valves 62, 65 in the main line are closed, the valve 61 in the line from the cooling gas source is opened, and the valve 66 in the line to the exhaust pump is closed, to push up the cylinder 53 with the pressure of the cooling gas and to thereby extend the pins 52a through 52d to a level higher than the wafer support surface. When etching is conducted, the valve 61 in the line from the cooling gas source is closed prior to the processing, and the valve 66 in the line toward the exhaust pump is opened, to draw down the cylinder 53 with a reduced pressure in the cylinder and to thereby retract the pins 52a through 52d into the substrate susceptor. Then, the valves 61, 66 in the positioning mechanism are closed, and the valves 62, 65 in the main line are opened, to cool the bottom surface of the wafer. In this manner, by connection using the cooling gas supply/exhausting system and the resin inlet tube, the pins can be extended and contracted easily.

FIGS. 6A through 6D show movements of the pins 52a through 52d in the wafer positioning mechanism. With reference to FIGS. 6A through 6D, a sequence of transporting, setting and removing a wafer is explained.

Figure 6A:
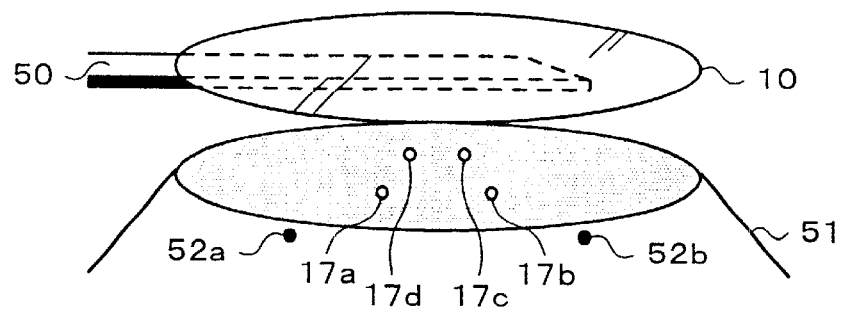
FIGS. 6A through 6D are schematic diagrams for explaining the positioning mechanism used in the embodiment of the invention.
Figure 6B:
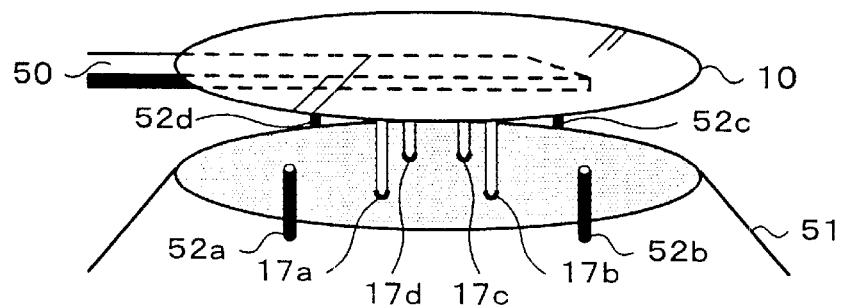
Figure 6C:
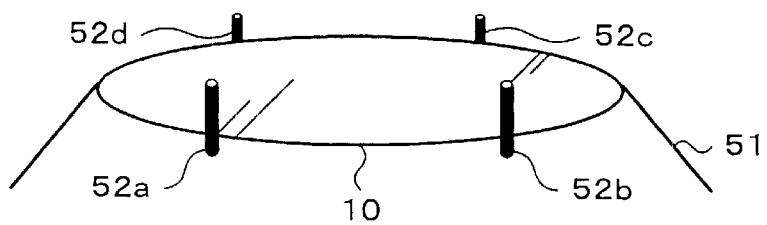
Figure 6D:
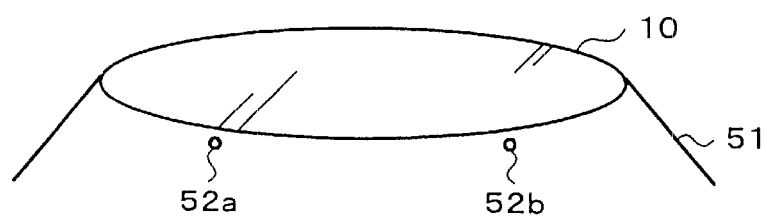

In the process for transporting a wafer into the chamber, the wafer 10 is transported by the a carrier arm 50 to above the substrate susceptor 1 as shown in FIG. 6A. Next as shown in FIG. 6B, the pins 52a, 52b, 52c, 52d of the positioning mechanism and pins 17a, 17b, 17c and 17d of the wafer push-up mechanism 16 are elevated simultaneously to extend beyond the wafer support surface. Keeping the pins 17a through 17d of the wafer push-up mechanism supporting the wafer 10, the carrier arm 50 is withdrawn, and the pins 17a through 17d of the wafer pushup mechanism 16 are pulled down as shown in FIG. 6C. In this sate, the side edge of the wafer 10 is guided by the pins 52a through 52d of the positioning mechanism. Therefore, a deviation, if any, of the wafer from the proper position is corrected, and the wafer 10 is properly brought onto the support surface. Then, as shown in FIG. 6D, the pins 52a through 52d are withdrawn into the substrate susceptor, and the transport of the wafer into the chamber is completed.

In the process for transporting the wafer from the chamber, those actions take place in the opposite sequence. That is, the pins 52a through 52d of the positioning mechanism are first extended beyond the substrate susceptor 1 prior to the electrically de-energizing sequence of the electrostatic chuck 20 to start the transport of the wafer from the chamber. In this status, even after the cooling gas is withdrawn from the bottom surface of the wafer 10, the pins 52a through 52d are already extended from the substrate susceptor 1 and regulate the wafer 10, the wafer 10 never comes off from its proper position. Then, after the pins 17a through 17d of the wafer push-up mechanism 16 move upward and lift up the wafer 10 to have it supported by the carrier arm, the pins 52a through 52d of the positioning mechanism and the pins 17a through 17d of the wafer push-up mechanism 16 are withdrawn into their sitting positions. Thereafter, the wafer 10 is transported from above the substrate susceptor 1 by the carrier arm 50, and the transport from the chamber is completed.

Figure 7A:
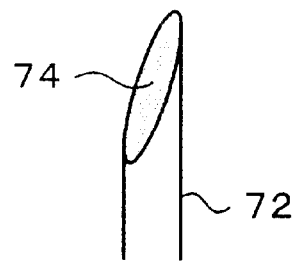
FIGS. 7A through 7D are schematic diagrams for explaining the positioning mechanism used in the embodiment of the invention.
Figure 7B:
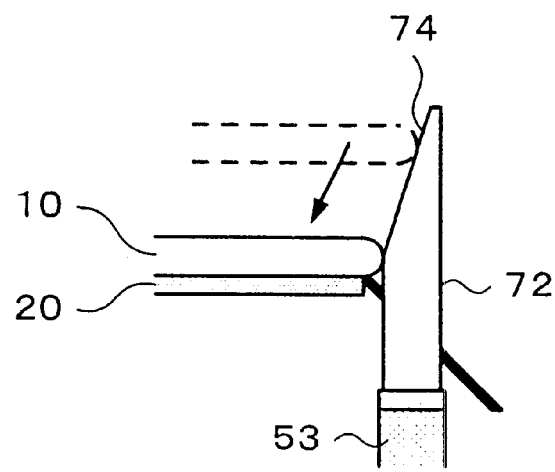

In the foregoing embodiment has been explained as using columnar pins 52a through 52d in the wafer positioning mechanism. However, these pins may be configured to include tapered portions 74 made by diagonally cutting columnar pins. By using pins 72 having tapered portions 74, the wafer brought to above the wafer support surface by the carrier arm even with a positional deviation can be slidably guided by the tapered portions 74 onto the proper position on the wafer support surface as shown in FIG. 7B.

Figure 7C:
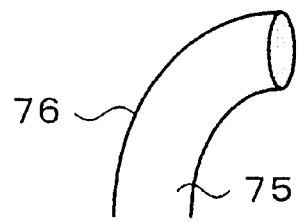
Figure 7D:
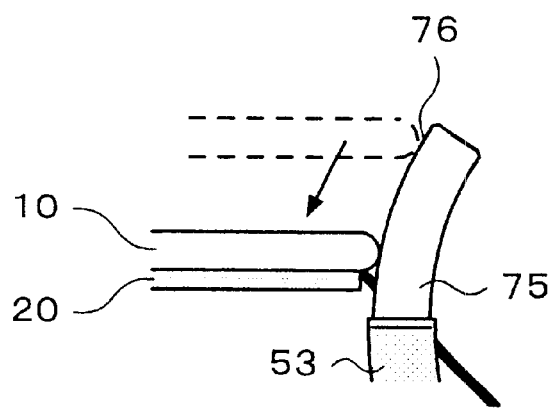

Alternatively, the pins 52 of the wafer positioning mechanism may be configured as curved columns having curved portions 76 as shown in FIG. 7C. By using the pins 75 with the curved portions 76, in the same manner as that by the pins 72 having tapered portions 74, the wafer the wafer brought to above the wafer support surface by the carrier arm even with a positional deviation can be slidably guided by the tapered portions 74 onto the proper position on the wafer support surface in the same manner as the pins 72 having tapered portions 74 as shown in FIG. 7D. In case of the pins 72 having tapered portions 74, a slight amount of reaction products may accumulate onto the tapered portions 74. However, by using the curved columnar shape including the curved portion 76, accumulation of reaction products is further reduced.

An actual etching process using the dry etching apparatus according to the above-explained embodiment is explained concretely. Assume here that films on the wafer to be etched are phosphorus-doped polycrystalline silicon (P Doped poly Si) stacked to 100 nm and tungsten silicide (WSix) stacked to 100 nm (gate electrode material) by thermal CVD (Chemical Vapor Deposition), and the processing pattern is made of a photo resist, 830 nm thick, applied by i-beam lithography. Conditions for this process are as follows:

gas flow rate: $Cl_2/HBr/O_2=65/20/4$ sccm
gas pressure: 0.4 Pa
inductively coupled (upper electrode) power: 1.2 kW
ion introducing power: 60 W
temperature of the substrate susceptor: 80 C.

Under these conditions, the films to be processed and the photo resist are changed to halides as shown at (1) through (4) below and discharged thereafter.

  (1)

  (2)

  (3)

  (4)

where * represents a radical of each substance and an active type of ions, or the like.

Reaction products shown (1) through (4) above are liable to stack when hitting the wall of the reaction chamber or other member, and may cause dissociative decomposition even when hitting high-energy electrons in the plasma. However, since the dry etching apparatus according to the invention does not include anything preventing gas flows near the wafer, re-accumulation occurs solely near the exhaust gas outlets, and never occurs near the wafer. Therefore, although the particles adhered onto the wafer at the start of the etching process may become a mask and may produce a non-etched portion, since there is no accumulation of reaction products as a source of particles near the wafer, particles never adhere onto the wafer during introduction of the gas or at the start of the electric discharge, and defective micro processing is reduced.

Figure 8:
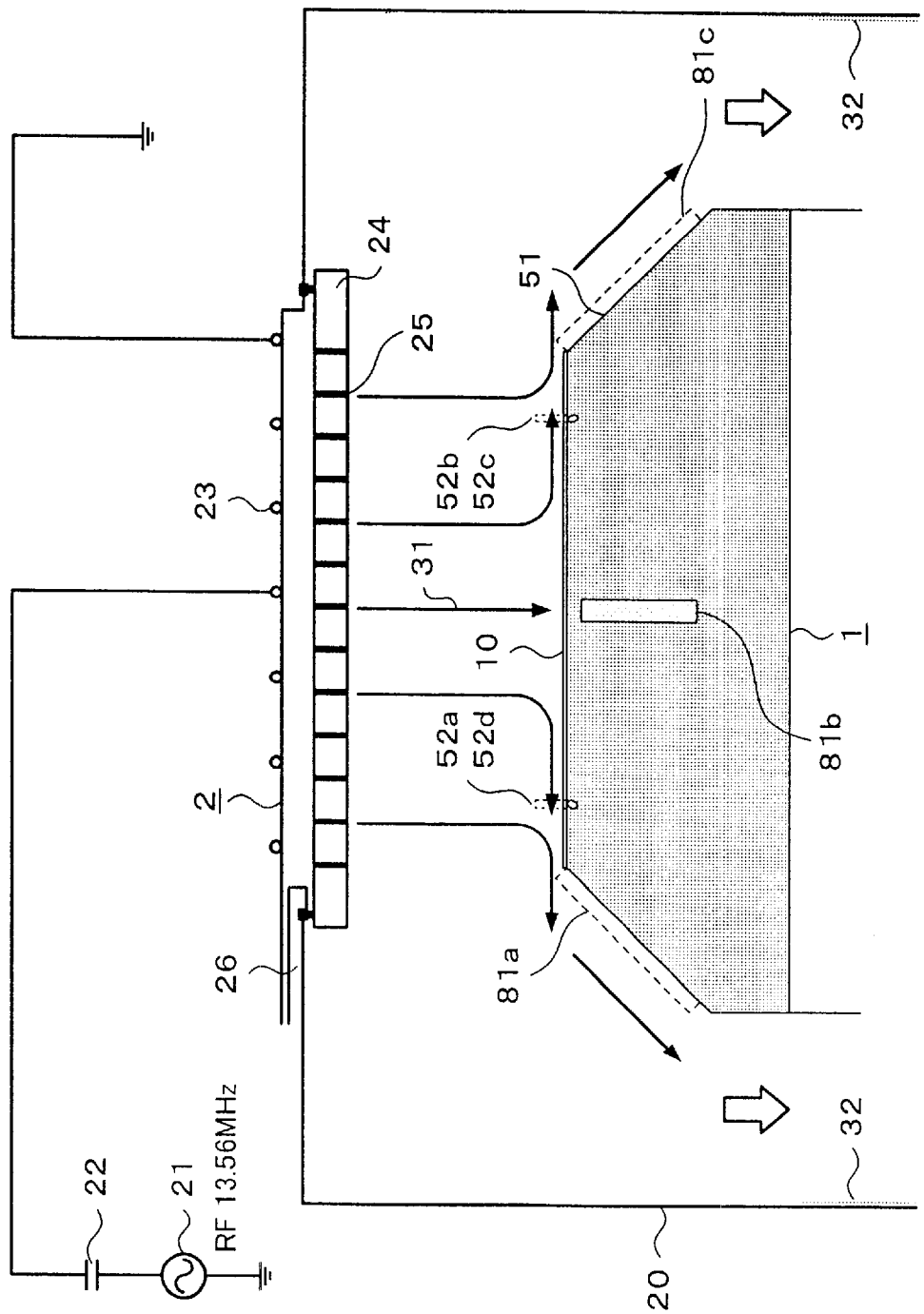
FIG. 8 is a schematic diagram showing a central part of a further embodiment of the invention.

Explained below is a further embodiment of the invention with reference to FIGS. 8, 9, 10A, 10B, 11A, 11B, 12A and 12B. FIG. 8 shows a central part of the further embodiment as an application of the invention in form of a dry etching apparatus using an inductively coupled plasma source similarly to the foregoing embodiment. FIG. 9 shows detailed construction of the substrate susceptor 1 used in the further embodiment. The dry etching apparatus is used for etching metal wiring on 200 mm wafers, for example. In FIGS. 8 and 9, elements or parts common to FIGS. 3 and 4 are labeled with common reference numerals.

As shown in FIGS. 8 and 9, the further embodiment is identical in all respects other than the wafer positioning mechanism. For simplicity, therefore, explanation of these common elements is omitted. In FIGS. 8 and 9, reference numerals 81a, 81b, 81c, and numeral 81d not appearing here, denote four plate-shaped stoppers made of a ceramic, for example, and appropriately positioned to form the wafer positioning mechanism. These four stoppers 81a through 81d prevents positional offset of the wafer when set in and removed from position. The stopper 81d is located at the position opposite from the stopper 81b, and is not illustrated in FIGS. 8 and 9.

These four stoppers 81a through 81d are provided on the susceptor cover 51 in intervals of 90 near the perimeter of the wafer support plane. For setting the wafer 10 in position and removing therefrom, they are raised from the susceptor cover 51 and used for their purpose. During etching, however, they are retracted down into the susceptor cover 51 to be flush with the susceptor cover 51.

The wafer positioning mechanism is made up of four stoppers 81a through 81d and four extend/contracting cylinders 53a through 53d, among others. These four extend/contracting cylinders 53a through 53d are mounted in contact with the lower electrode 11. When they are mounted, since the contour of the substrate susceptor 1 is amply tapered, they can be mounted with no obstacle, not requiring special processing or using a special structure.

Figure 10A:
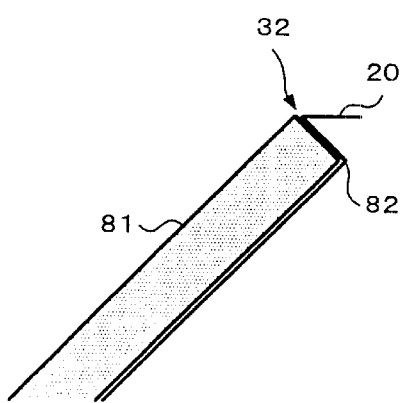
FIGS. 10A and 10B are schematic diagrams for explaining the positioning mechanism used in the further embodiment of the invention.
Figure 10B:
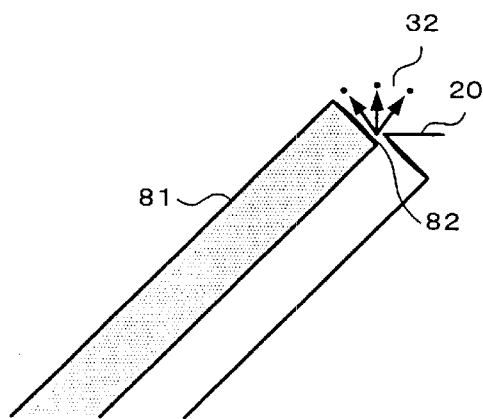

The extend/contracting cylinders 53a through 53d are connected to the cooling gas supply/exhaust system to the bottom surface of the wafer similarly to that of the former embodiment. Therefore, these extend/contracting cylinders 53a through 53d are driven by a pressure of the cooling gas supplied to the bottom surface of the wafer, and raise the stoppers 81a through 81d while keeping a predetermined angle relative to the wafer support plane as shown in FIGS. 10A and 10B. FIG. 10A shows one of the stoppers 81a through 81d held flush with the susceptor cover 51 whilst FIG. 10B shows it raised from the susceptor cover 51.

When each stopper 81 is in the raised position from the susceptor cover 51, the upper side surface 82 of the stopper 81 is held with a predetermined angle relative to the wafer support plane. Therefore, even if the wafer is offset from its proper position when brought to above the position by the carrier arm, the wafer is guided by the upper side surfaces 82 to slide down and reliably sit on the predetermined position.

Figure 11A:
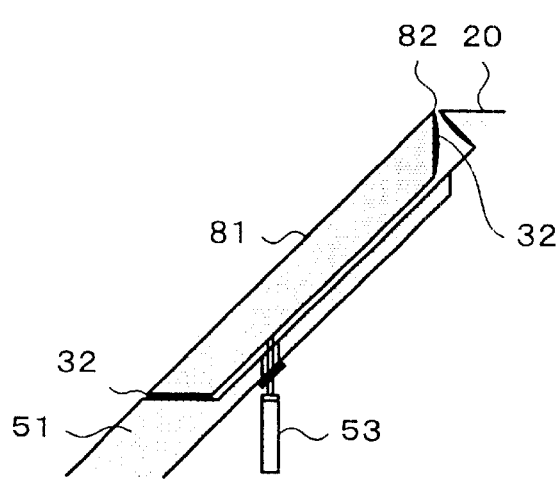
FIGS. 11A and 11B are schematic diagrams for explaining the positioning mechanism used in the further embodiment of the invention.
Figure 11B:
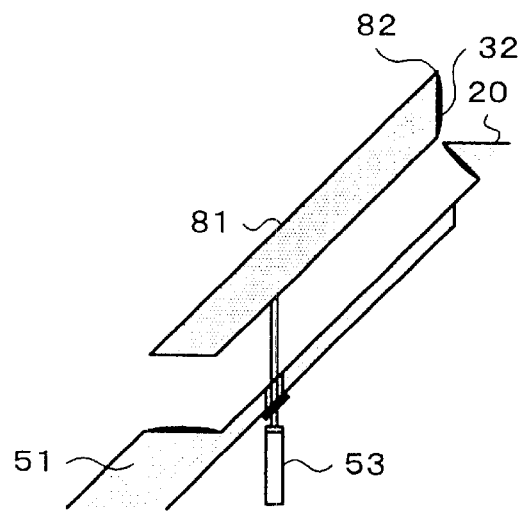
Figure 12A:
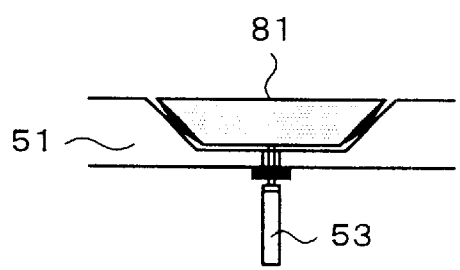
FIGS. 12A and 12B are schematic diagrams for explaining the positioning mechanism used in the further embodiment of the invention.
Figure 12B:
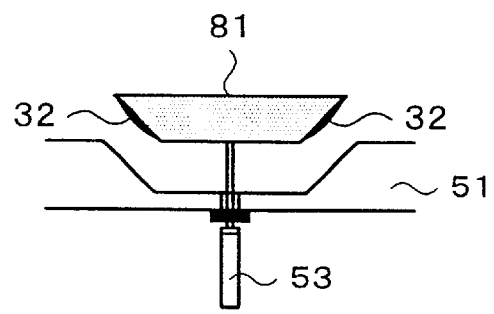

In the further embodiment explained above, the stoppers 81 are configured to rise with a predetermined angle with respect to the wafer support plane. However, they may be raised perpendicularly of the wafer support plane as shown in FIGS. 11A and 11B and FIGS. 12A and 12B. In these cases, the upper side surface 82 of each stopper 81 is cut along a plane perpendicular to the wafer support plane to form a s inversely tapered configuration. FIGS. 11A and 11B show one of such stoppers 81 viewed from its lateral direction whereas FIGS. 12A and 12B show it as viewed from a diagonally upper direction. FIGS. 11A and 12A show it held flush with the susceptor cover 51, and FIGS. 11B and 12B show it raised from the susceptor cover 51.

That is, the example explained above involves the possibility that reaction products 32 accumulates on the upper side surfaces 82 of the stoppers 81 and produces dust due to friction in the rising motion of the stoppers 81 (see FIGS. 10A and 10B). However, by employing the inversely tapered configuration made by cutting the upper side surface 82 of each stopper 81 perpendicularly of the wafer support plane as shown in FIGS. 11A and 11B, friction between the upper side surface 82 and the electrostatic chuck 20 is prevented not to produce dust.

Next explained is a sequence of transporting, setting and removing a wafer. In the process for transporting a wafer into the chamber, the wafer 10 is transported by the a carrier arm to above the substrate susceptor 1. Next, the stoppers 81a through 81d of the positioning mechanism are railed from the susceptor cover 51, and the pins 17a, 17b, 17c and 17d of the wafer push-up mechanism 16 are elevated simultaneously to extend beyond the wafer support plane. Keeping the pins 17a through 17d of the wafer push-up mechanism supporting the wafer 10, the carrier arm is withdrawn, and the pins 17a through 17d of the wafer push-up mechanism 16 are pulled down. In this sate, the side edge of the wafer 10 is guided by the stoppers 81a through 81d of the positioning mechanism. Therefore, a deviation, if any, of the wafer from the proper position is corrected, and the wafer 10 is properly brought onto the support plane. Then, the stoppers 81a through 81d 52a are withdrawn into the susceptor cover 51, and the transport of the wafer into the chamber is completed.

In the process for transporting the wafer from the chamber, those actions take place in the opposite sequence. That is, the stoppers 81a through 81d of the positioning mechanism are raised from the susceptor cover 51 prior to the electrically de-energizing sequence of the electrostatic chuck 20 to start the transport of the wafer from the chamber. In this status, even after the cooling gas is withdrawn from the bottom surface of the wafer 10, the stoppers 81a through 81d raised from the susceptor cover 51 hold the wafer 10 in position, the wafer 10 never comes off from its proper position. Then, after the pins 17a through 17d of the wafer push-up mechanism 16 move upward and lift up the wafer 10 to have it supported by the carrier arm, the stoppers 81a through 81d of he positioning mechanism and the pins 17a through 17d of the wafer push-up mechanism 16 are withdrawn into their sit ting positions. Thereafter, the wafer 10 is transported from above the substrate susceptor 1 by the carrier arm 50, and the transport from the chamber is completed.

An actual etching process using the dry etching apparatus according to the further embodiment is explained concretely. Assume here that the film on the wafer to be etched is a multi-layered film (wiring material) of tungsten (W) stacked as thick as 20 nm by sputtering and tungsten (W) stacked as thick as 80 nm by thermal CVD, and the processing pattern is made of a photo resist, 1030 nm thick, applied by i-beam lithography. Conditions for this process are as follows:

gas flow rate: $SF_6/Cl_2=200/40$ sccm
gas pressure: 0.4 Pa
inductively coupled (upper electrode) power: 0.8 kW
ion introducing power: 100 W
temperature of the substrate susceptor: 0 C.

Under these conditions, the film to be processed and the photo resist are changed to halides as shown at (5) through (8) below and discharged thereafter.

$$W+F^*WF_6 \qquad (5)$$
$$W+Cl^*WCl_x \qquad (6)$$

$$C + F^* CF_4 \tag{7}$$

$$C + Cl^* CCl_4 \tag{8}$$

where * represents a radical of each substance and an active type of ions, or the like.

Among the reaction products shown at (5) through (8) above, $WF_6$ and $CF_4$ have high vapor pressures, and are less liable to accumulate again. In contrast, $WCl_x$ and $CCl_4$ are liable accumulate when hitting the wall of the reaction chamber and other members and are apt to produce particles. However, according to the invention, since such reaction products as a source of particles do not accumulate near the wafer, particles never adhere onto the wafer during introduction of the gas or at the start of the electric discharge, and defective micro processing is reduced.

Both embodiments shown above have been explained as applying the invention to a dry etching apparatus using an inductively coupled plasma source. However, the invention is applicable also to a dry etching apparatus using a capacitively coupled plasma source. Additionally, it is also applicable to any dry etching apparatus of a type configured to excite an etching gas to thereby cause etching by using an energy other than electric discharge plasma, which may be light or ion beams, for example.

In the present invention, since a susceptor cover is attached to a substrate susceptor to form a tapered shape, and the opposite flows of a gas toward the electric discharge plasma are prevented by omitting other members from around the wafer support plane to thereby ensure a flatness, the etching gas moves smoothly toward the exhaust gas outlets located in a lower level in the reaction chamber. Therefore, according to the invention, reaction products generated by interaction with the wafer and products of sputtering of members of the apparatus do not accumulate near the wafer although it may accumulate near the exhaust gas outlets located in a lower level in the reaction chamber. Therefore, adhesion of such products of interaction or sputtering onto the waver is minimized.

Moreover, in the present invention, pins or stoppers of the wafer positioning mechanism located with intervals of 90 along the perimeter of the wafer support plane are movable to extend to a level higher than the wafer support plane only upon setting or removing the wafer so as to fit onto the side edge of the wafer, and they are withdrawn to sit within the substrate susceptor during etching. Therefore, the invention can prevent positional offset of the waver upon setting or removing the wafer by means of the positioning mechanism without adversely affect the etching quality of the wafer, and can improve the reliability of wafer transport.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A dry etching apparatus, comprising:
    a substrate susceptor having a portion for contact with a wafer, having a diameter not larger than the diameter of the wafer, and no element provided in any level higher than a top surface of the wafer and in the same level as a bottom surface of the wafer around the wafer;
    a positioning mechanism for preventing positional offset of the wafer upon setting in or removal of the wafer, said positioning mechanism being capable of sitting fully inside said substrate susceptor, said positioning mechanism including pins made of an insulating material and movable to extend from said substrate susceptor and retract down into same, said pins being moved only during transport of the wafer to project to a level higher than the top surface of the wafer; and
    a cover made of an insulating material provided to shape a portion of the substrate susceptor around the wafer excluding a portion thereof in contact with the wafer into a tapered contour.

2. The dry etching apparatus according to claim 1 wherein each said pin of the positioning mechanism has a tapered portion or a curved configuration to correct not only an offset of the wafer upon setting and removing it but also an offset caused by transport using an arm.

3. The dry etching apparatus according to claim 1 wherein said cover includes a positioning mechanism for preventing an offset of the wafer upon setting and removing same, part of said cover being raised only during transport of the wafer.

4. The dry etching apparatus according to claim 1 wherein said positioning mechanism is connected to a supply/exhaust line of a gas for cooling the wafer, said positioning mechanism being driven by a gas pressure.

5. A method for dry etching a substrate, comprising the step of:
    using a drying etching apparatus in which a substrate susceptor has a portion for contact with a wafer, having a diameter not larger than the diameter of the wafer, and no element is provided in any level higher than a top surface of the wafer and in the same level as a bottom surface of the wafer around the wafer, the dry etching apparatus including: (1) a cover made of an insulative material provided to shape a portion of the substrate susceptor around the wafer excluding a portion thereof in contact with the wafer into a tapered contour; and (2) a positioning mechanism for preventing positional offset of the wafer upon setting in or removal of the wafer, said position mechanism being capable of sitting fully inside said substrate susceptor, said positioning mechanism including pins made of an insulating material and movable to extend from said substrate susceptor and retract down into same, said pins being moved only during transport of the wafer to project to a level higher than the top surface of the wafer.

6. The method according to claim 5 wherein each said pin of the positioning mechanism has a tapered portion or a curved configuration to correct not only an offset of the wafer upon setting and removing it but also an offset caused by transport using an arm.

7. The method according to claim 5 wherein said cover includes a positioning mechanism for preventing an offset of the wafer upon setting and removing same, part of said cover being raised only during transport of the wafer.

8. The method according to claim 5 wherein said positioning mechanism is connected to a supply/exhaust line of a gas for cooling the wafer, said positioning mechanism being driven by a gas pressure.

* * * * *